(12) United States Patent
Huang et al.

(10) Patent No.: US 11,769,850 B2
(45) Date of Patent: Sep. 26, 2023

(54) OPTOELECTRONIC INTEGRATED SUBSTRATE, PREPARATION METHOD THEREOF, AND OPTOELECTRONIC INTEGRATED CIRCUIT

(71) Applicant: BOE Technology Group Co., Ltd., Beijing (CN)

(72) Inventors: Rui Huang, Beijing (CN); Haibin Zhu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 57 days.

(21) Appl. No.: 17/500,963

(22) Filed: Oct. 14, 2021

(65) Prior Publication Data
US 2022/0271185 A1 Aug. 25, 2022

(30) Foreign Application Priority Data
Feb. 19, 2021 (CN) .......................... 202110191311.0

(51) Int. Cl.
*H01L 31/105* (2006.01)
*H01L 31/02* (2006.01)
*H01L 31/0224* (2006.01)
*H01L 31/20* (2006.01)

(52) U.S. Cl.
CPC .... *H01L 31/1055* (2013.01); *H01L 31/02005* (2013.01); *H01L 31/022408* (2013.01); *H01L 31/202* (2013.01)

(58) Field of Classification Search
CPC ........... H01L 31/1055; H01L 31/02005; H01L 31/022408; H01L 31/202; H01L 31/108; H01L 31/109; H01L 31/1085; H01L 27/1443; H01L 21/8249
See application file for complete search history.

(56) References Cited

U.S. PATENT DOCUMENTS

| | | | |
|---|---|---|---|
| 2005/0179964 A1* | 8/2005 | Izumi | ................ H01L 27/14609 257/E31.085 |
| 2008/0129942 A1* | 6/2008 | Shin | .................... H01L 27/1446 257/E31.073 |
| 2009/0152563 A1 | 6/2009 | Hayashi et al. | |

(Continued)

FOREIGN PATENT DOCUMENTS

| CN | 101465360 A | 6/2009 |
|---|---|---|
| CN | 102629613 A | 8/2012 |

(Continued)

OTHER PUBLICATIONS

The First Office Action dated May 25, 2022 for Chinese Patent Application No. 202110191311.0 and English Translation.

*Primary Examiner* — Sitaramarao S Yechuri
(74) *Attorney, Agent, or Firm* — Ling Wu; Stephen Yang; Ling and Yang Intellectual Property (57) ABSTRACT

An optoelectronic integrated substrate, a preparation method thereof and an optoelectronic integrated circuit. The electronic integrated substrate includes a base substrate and an electronic device and a photo-diode disposed on the base substrate, wherein the photo-diode includes an ohmic contact layer and an intrinsic amorphous silicon layer, and the ohmic contact layer and the intrinsic amorphous silicon layer are sequentially arranged along a direction parallel to the plane of the base substrate and are connected.

17 Claims, 4 Drawing Sheets

(56) References Cited

U.S. PATENT DOCUMENTS

| | | | | |
|---|---|---|---|---|
| 2009/0236504 A1* | 9/2009 | Yamaguchi | .......... | G09G 3/3406 |
| | | | | 257/431 |
| 2010/0132791 A1* | 6/2010 | Kim | .................. | H01L 31/03762 |
| | | | | 136/258 |
| 2012/0267623 A1* | 10/2012 | Isobe | .................. | H01L 27/1156 |
| | | | | 438/156 |
| 2016/0013242 A1 | 1/2016 | Yang | | |

FOREIGN PATENT DOCUMENTS

| | | |
|---|---|---|
| CN | 102820313 A | 12/2012 |
| CN | 107331726 A | 11/2017 |

* cited by examiner

OPTOELECTRONIC INTEGRATED SUBSTRATE, PREPARATION METHOD THEREOF, AND OPTOELECTRONIC INTEGRATED CIRCUIT

CROSS-REFERENCE TO RELATED APPLICATION

The present application claims the priority of Chinese Patent Application No. 202110191311.0 filed to the CNIPA on Feb. 19, 2021, the content of which is hereby incorporated by reference.

TECHNICAL FIELD

The present disclosure relates to, but is not limited to, the field of optoelectronic technologies, in particular to an optoelectronic integrated substrate, a preparation method thereof, and an optoelectronic integrated circuit.

BACKGROUND

Visible light communication technology is a communication technology using visible light as information carrier, which not only can effectively avoid the risk of electromagnetic signal leakage in conventional radio communication, but also has advantages such as low energy consumption, and thus is conducive to building a safe and reliable information network. With the development of visible light communication, the OptoElectronic Integrated Circuit (OEIC) technology, which integrates the functions of signal receiving and signal amplification, is gaining more and more attention, and has been gradually applied in the fields of Internet of Things and smart home. Nevertheless, the current optoelectronic integrated circuit has the problem of high bit error rate.

SUMMARY

The following is a summary of the subject matter described in the present disclosure in detail. The summary is not intended to limit the scope of protection of the claims.

An embodiment of the present disclosure provides an optoelectronic integrated substrate, including a base substrate, and an electronic device and a photo-diode disposed on the base substrate, wherein the photo-diode includes an ohmic contact layer and an intrinsic amorphous silicon layer, and the ohmic contact layer and the intrinsic amorphous silicon layer are sequentially arranged along a direction parallel to a plane of the base substrate and are connected.

In an exemplary embodiment, the photo-diode further includes a first electrode, a second electrode and a composite insulating layer, and the composite insulating layer is provided with a first opening exposing the ohmic contact layer; wherein the first electrode is disposed on a side wall of the first opening close to the electronic device and connected to the ohmic contact layer, and the second electrode is disposed on a side wall of the first opening away from the electronic device; the intrinsic amorphous silicon layer is disposed in the first opening and includes a first side close to the electronic device and a second side away from the electronic device; the first side of the intrinsic amorphous silicon layer is connected to the ohmic contact layer, and the second side of the intrinsic amorphous silicon layer is connected to the second electrode.

In an exemplary embodiment, the photo-diode further includes a first electrode, a second electrode and a composite insulating layer, and the composite insulating layer is provided with a first opening exposing the ohmic contact layer; wherein the first electrode is disposed on a side wall of the first opening close to the electronic device, and the second electrode is disposed on a side wall of the first opening away from the electronic device and connected to the ohmic contact layer; the intrinsic amorphous silicon layer is disposed in the first opening and includes a first side close to the electronic device and a second side away from the electronic device; the first side of the intrinsic amorphous silicon layer is connected to the first electrode, and the second side of the intrinsic amorphous silicon layer is connected to the ohmic contact layer.

In an exemplary embodiment, the ohmic contact layer includes a first surface of which a normal direction is a first direction and a second surface of which a normal direction is a second direction, wherein the second direction is a direction of incident light, and the first direction intersects the second direction; and the first surface of the ohmic contact layer is in contact connection with the first side or the second side of the intrinsic amorphous silicon layer.

In an exemplary embodiment, the second surface of the ohmic contact layer is in contact connection with the first electrode or the second electrode.

In an exemplary embodiment, the electronic device includes a thin film transistor; the thin film transistor includes a gate electrode, an active layer, a source electrode and a drain electrode, the first electrode and the second electrode of the photo-diode are disposed in a same layer as the source electrode and the drain electrode of the thin film transistor, and the ohmic contact layer of the photo-diode is disposed in a same layer as the active layer of the thin film transistor.

In an exemplary embodiment, the thin film transistor further includes a second insulating layer and a third insulating layer, wherein the second insulating layer covers the active layer, the gate electrode is disposed on the second insulating layer, the third insulating layer covers the gate electrode, a first via exposing the active layer is disposed on the second insulating layer and the third insulating layer, and the first via and the first opening are formed through a same patterning process.

In an exemplary embodiment, the ohmic contact layer includes a P-type doped semiconductor or an N-type doped semiconductor.

In an exemplary embodiment, a thickness of the intrinsic amorphous silicon layer is 50 nm to 500 nm.

An embodiment of the present disclosure further provides an optoelectronic integrated circuit, including any aforementioned optoelectronic integrated substrate.

An embodiment of the present disclosure further provides a preparation method of an optoelectronic integrated substrate, including: forming an electronic device and a photo-diode on a base substrate; wherein the photo-diode includes an ohmic contact layer and an intrinsic amorphous silicon layer, and the ohmic contact layer and the intrinsic amorphous silicon layer are sequentially arranged along a direction parallel to a plane of the base substrate and are connected.

In an exemplary embodiment, forming the photo-diode on the base substrate includes: forming the ohmic contact layer on the base substrate; forming a composite insulating layer, wherein the composite insulating layer is provided with a first opening exposing the ohmic contact layer; and forming a first electrode and a second electrode, wherein the first electrode is disposed on a side wall of the first opening close to the electronic device and connected to the ohmic contact layer, and the second electrode is disposed on a side wall of the first opening away from the electronic device; forming the intrinsic amorphous silicon layer in the first opening, wherein the intrinsic amorphous silicon layer includes a first side close to the electronic device and a second side away from the electronic device in a plane parallel to the base substrate; the first side of the intrinsic amorphous silicon layer is connected to the ohmic contact layer, and the second side of the intrinsic amorphous silicon layer is connected to the second electrode.

In an exemplary embodiment, forming the photo-diode on the base substrate includes: forming the ohmic contact layer on the base substrate; forming a composite insulating layer, wherein the composite insulating layer is provided with a first opening exposing the ohmic contact layer; and forming a first electrode and a second electrode, wherein the first electrode is disposed on a side wall of the first opening close to the electronic device, and the second electrode is disposed on a side wall of the first opening away from the electronic device and connected to the ohmic contact layer; forming the intrinsic amorphous silicon layer in the first opening, wherein the intrinsic amorphous silicon layer includes a first side close to the electronic device and a second side away from the electronic device in a plane parallel to the base substrate; the first side of the intrinsic amorphous silicon layer is connected to the first electrode, and the second side of the intrinsic amorphous silicon layer is connected to the ohmic contact layer.

In an exemplary embodiment, the electronic device includes a thin film transistor, and forming the electronic device on the base substrate includes: forming an active layer on the base substrate; forming a second insulating layer covering the active layer, and a gate electrode disposed on the second insulating layer; forming a third insulating layer covering the gate electrode, wherein the third insulating layer is provided with first vias exposing the active layer; and forming a source electrode and a drain electrode on the third insulating layer, wherein the source electrode and the drain electrode are respectively connected to the active layer through the first vias.

In an exemplary embodiment, the active layer and the ohmic contact layer are disposed in a same layer and formed through a same patterning process; the first vias and the first opening are formed through a same patterning process; the source electrode and the drain electrode are disposed in a same layer as the first electrode and the second electrode, and are formed through a same patterning process.

Other aspects may be comprehended upon reading and understanding of the drawings and the detailed description.

BRIEF DESCRIPTION OF DRAWINGS

The drawings are used to provide an understanding of technical solutions of the present disclosure, form a part of the specification, and are used to explain, together with the embodiments of the present disclosure, the technical solutions of the present disclosure and are not intended to form limitations on the technical solutions of the present disclosure.

DETAILED DESCRIPTION

Hereinafter embodiments of the present disclosure will be described in detail with reference to the accompanying drawings. It should be noted that the embodiments may be implemented in many different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, the size of each constituent element, or the thickness or area of a layer, is sometimes exaggerated for clarity. Therefore, an implementation of the present disclosure is not necessarily limited to the size shown, and a shape and size of each component in the drawings do not reflect true proportions. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientation or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between constituent elements may be appropriately changed according to the direction in which each of the constituent elements is described. Therefore, they are not limited to the wordings in the specification, and may be altered appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skill in the art may understand the meanings of the terms in the present disclosure according to situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current may flow through the drain electrode, the channel region and the source electrode. It should be noted that in this specification, the channel region refers to a region that current mainly flows through.

In this specification, the first electrode may be a drain electrode and the second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element having a certain electric function. The "element having a certain electrical function" is not particularly limited as long as reception of electrical signals between connected constituent elements can be implemented. Examples of the "element having a certain electric function" include not only electrodes and wirings, but also switch elements such as transistors, resistors, inductors, capacitors, and other elements having various functions.

In this specification, "parallel" refers to a state in which two straight lines form an angle between −10 degrees and 10 degrees and thus, includes a state in which the angle is between −5 degrees and 5 degrees. In addition, "perpendicular" refers to a state in which an angle formed by two straight lines is above 80 degrees and below 100 degrees, and thus may include a state in which the angle is above 85 degrees and below 95 degrees.

In this specification, "film" and "layer" may be interchangeable. For example, sometimes "conductive layer" may be replaced by "conductive film". Similarly, "insulating film" may sometimes be replaced by "insulating layer".

"About" in the present disclosure means that limits are not restricted strictly, and values within ranges of process and measurement errors are permissible.

Figure 1:
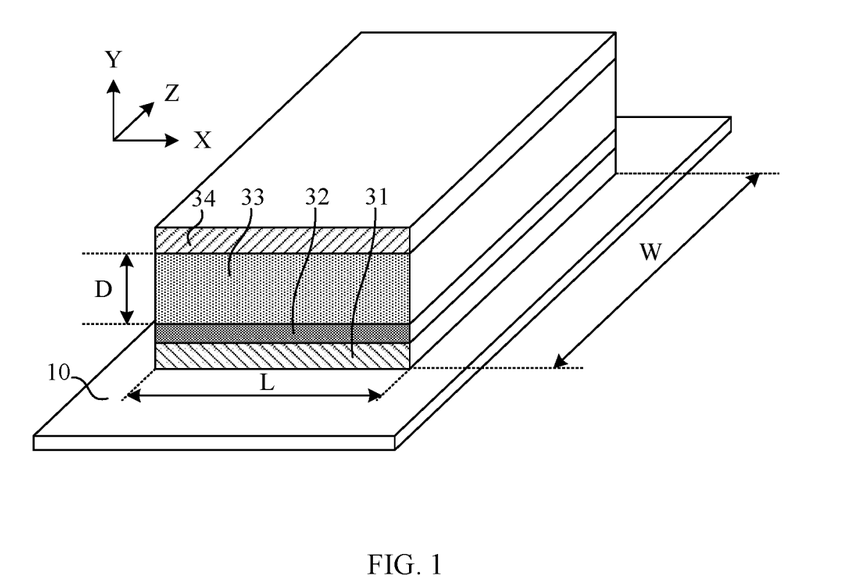
FIG. 1 is a schematic diagram of a structure of a vertical photo-diode in an optoelectronic integrated substrate.

Currently, the main structure of an optoelectronic integrated circuit includes an optoelectronic integrated substrate, which integrates an optical device and an electronic device on a same substrate. The optical device may be a photo-diode and the electronic device may be a thin film transistor. The optoelectronic integrated circuits nowadays have a problem of high bit error rate, which is caused by photo-diodes of vertical structure in optoelectronic integrated substrates. FIG. 1 is a schematic diagram of a structure of a vertical photo-diode in an optoelectronic integrated substrate. As shown in FIG. 1, the photo-diode has a vertical structure, and a first electrode 31, an ohmic contact layer 32, an intrinsic amorphous silicon layer 33 and a second electrode 34 are arranged along a direction perpendicular to a base substrate 10 (second direction Y). In a plane perpendicular to the base substrate, the first electrode 31 is disposed on the substrate 10, the ohmic contact layer 32 is disposed on a side of the first electrode 31 close to the second electrode 34, the intrinsic amorphous silicon layer 33 is disposed on a side of the ohmic contact layer 32 close to the second electrode 34, the second electrode 34 is disposed on a side of the intrinsic amorphous silicon layer 33 away from the first electrode 31, and a direction perpendicular to the base substrate 10 is the direction of incident light. The light receiving surface and junction surface of the intrinsic amorphous silicon layer 33 are parallel to the plane of the base substrate, and are each located on a plane parallel to the base substrate (XZ plane), and the light receiving area and junction area are roughly the same. For example, in the XZ plane, if the intrinsic amorphous silicon layer 33 has a length L in the first direction X and a width W in the third direction Z, the light receiving area of the intrinsic amorphous silicon layer 33 is about W*L and the junction area is about W*L.

According to a formula for calculating RC delay time $\tau_C$, $$\tau_C = 2.2 R_L \times C_j = 2.2 R_L \times \frac{W \times L \times \varepsilon}{D}$$

Herein, $R_L$ is a load resistance, $C_j$ is a PN junction capacitance, $\varepsilon$ is a dielectric constant of the intrinsic amorphous silicon layer, and D is the thickness of the intrinsic amorphous silicon layer.

From the formula for calculating the RC delay time $\tau_C$, it can be seen that RC delay time $\tau_C$ of a photo-diode of vertical structure is proportional to the junction area W*L and inversely proportional to the thickness D of the intrinsic amorphous silicon layer. Improving the response speed of the photo-diode, that is, reducing the RC delay time $\tau_C$, may be achieved by reducing the junction area. However, the responsivity of a photo-diode is proportional to the light receiving area, the larger the light receiving area, the higher the responsivity of the photo-diode, and the smaller the light receiving area, the lower the responsivity of the photo-diode. Thus reducing the junction area, which is equivalent to reducing the light receiving area, will lead to a decrease in the responsivity of the photo-diode. Therefore, in the above technology, usually a large light receiving area is configured to ensure the responsivity of the photo-diode, and the response speed of the photo-diode is improved by increasing the thickness D of the intrinsic amorphous silicon layer. However, the increase of the thickness D of the intrinsic amorphous silicon layer does not significantly increase the absorption of short wavelength signal light, but increases the absorption of long wavelength ambient light by the intrinsic amorphous silicon layer, which reduces the spectral selectivity, resulting in high bit error rate.

In order to overcome the defect of high bit error rate of current optoelectronic integrated circuits, an embodiment of the present disclosure provides an optoelectronic integrated substrate. In an exemplary embodiment, the electronic integrated substrate may include a base substrate, and an electronic device and a photo-diode disposed on the base substrate, wherein the photo-diode at least includes an ohmic contact layer and an intrinsic amorphous silicon layer, and the ohmic contact layer and the intrinsic amorphous silicon layer are sequentially disposed along a direction parallel to the plane of the base substrate (i.e., perpendicular to the direction of incident light) and are connected, so that the junction plane is parallel or substantially parallel to the direction of incident light.

Figure 2:
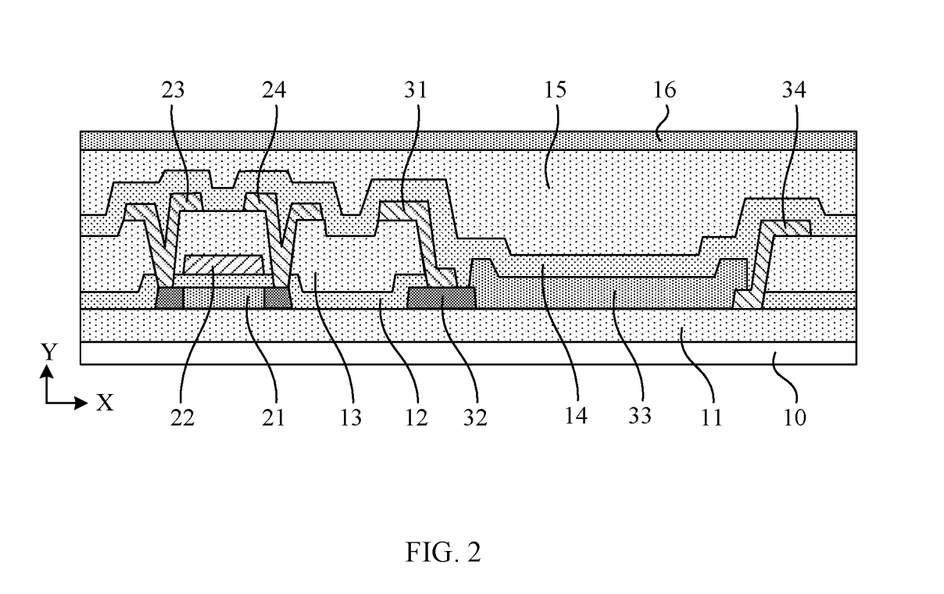
FIG. 2 is a schematic diagram of a structure of an optoelectronic integrated substrate according to an exemplary embodiment of the present disclosure.

FIG. 2 is a schematic diagram of a structure of an optoelectronic integrated substrate in an exemplary embodiment of the present disclosure. As shown in FIG. 2, the optoelectronic integrated substrate includes a base substrate 10 and an optical device and an electronic device disposed on the base substrate 10. In an exemplary embodiment, the optical device may be a photo-diode and the electronic device may be a thin film transistor. The photo-diode may include a first electrode 31, an ohmic contact layer 32, an intrinsic amorphous silicon layer 33 and a second electrode 34. The ohmic contact layer 32, the intrinsic amorphous silicon layer 33 and the second electrode 34 are sequentially disposed along a direction parallel to the plane of the base substrate. The ohmic contact layer 32 and the intrinsic amorphous silicon layer 33 are arranged between the first electrode 31 and the second electrode 34. The first electrode 31 is connected to the ohmic contact layer 32, the ohmic contact layer 32 is connected to the intrinsic amorphous silicon layer 33, and the intrinsic amorphous silicon layer 33 is connected to the second electrode 34. The thin film transistor may include an active layer 21, a gate electrode 22, a source electrode 23 and a drain electrode 24, wherein the source electrode 23 and the drain electrode 24 are respectively connected to the active layer 21 through vias.

In an exemplary embodiment, the optoelectronic integrated substrate further includes a first insulating layer 11, a second insulating layer 12 and a third insulating layer 13. The first insulating layer 11 is disposed on the base substrate, and the active layer 21 of the thin film transistor and the ohmic contact layer 32 of the photo-diode are disposed on the first insulating layer 11. The second insulating layer 12 covers the active layer 21 and the ohmic contact layer 32, and the gate electrode 22 of the thin film transistor is disposed on the second insulating layer 12. The third insulating layer 13 covers the gate electrode 22.

In an exemplary embodiment, the second insulating layer 12 and the third insulating layer 13 in the region where the thin film transistor is located are provided with first vias. The source electrode 23 and the drain electrode 24 are disposed on the third insulating layer 13, and are respectively connected to the active layer 21 through the first vias.

In an exemplary embodiment, the second insulating layer 12 and the third insulating layer 13 in the region where the photo-diode is located form a composite insulating layer. The composite insulating layer is provided with a first opening, which exposes part of the ohmic contact layer 32. The first electrode 31 is disposed on a side wall of the first opening close to the thin film transistor and connected to the ohmic contact layer 32, and the second electrode 34 is disposed on a side wall of the first opening away from the thin film transistor. The first electrode 31 and the second electrode 34 are spaced apart. The intrinsic amorphous silicon layer 33 is disposed in the first opening, including a first side close to the thin film transistor and a second side away from the thin film transistor. The first side of the intrinsic amorphous silicon layer 33 is connected to the ohmic contact layer 32, and the second side of the intrinsic amorphous silicon layer 33 is connected to the second electrode 34. In this exemplary embodiment, the ohmic contact layer 32 is located on a side of the first opening close to the thin film transistor.

In an exemplary embodiment, the optoelectronic integrated substrate further includes a fourth insulating layer 14, a planarization layer 15 and a protective layer 16, the fourth insulating layer 14 covering the source electrode 23, the drain electrode 24, the first electrode 31, the second electrode 34 and the intrinsic amorphous silicon layer 33, the planarization layer 15 being disposed on the fourth insulating layer 14, and the protective layer 16 being disposed on the planarization layer 15.

In an exemplary embodiment, the active layer 21 of the thin film transistor is disposed in a same layer as the ohmic contact layer 32 of the photo-diode, and they are simultaneously formed through a same patterning process.

In an exemplary embodiment, the source electrode 23 and the drain electrode 24 of the thin film transistor are disposed in a same layer as the first electrode 31 and the second electrode 34 of the photo-diode, and are simultaneously formed through a same patterning process.

In an exemplary embodiment, the first via of the thin film transistor and the first opening of the photo-diode are simultaneously formed through a same patterning process.

In an exemplary embodiment, the ohmic contact layer 32 includes a first surface of which a normal direction is a first direction X and a second surface of which a normal direction is a second direction Y, the second direction Y is the direction of incident light (perpendicular to the base substrate), and the first direction X intersects the second direction Y. In an exemplary embodiment, the first direction X and the second direction Y may be perpendicular to each other.

In an exemplary embodiment, the first surface of the ohmic contact layer 32 is in contact connection with the first side of the intrinsic amorphous silicon layer 33 to form a junction region with a junction direction being in the first direction X, and the junction direction is perpendicular to the direction of incident light, that is, the plane of the junction region is parallel to the direction of incident light.

In an exemplary embodiment, the second surface of the ohmic contact layer 32 is in contact connection with the first electrode 31.

In an exemplary embodiment, a thickness of the intrinsic amorphous silicon layer 33 may be about 50 nm to 500 nm.

In an exemplary embodiment, a distance between the ohmic contact layer 32 and the second electrode 34 may be greater than 1000 nm.

A preparation process of the optoelectronic integrated substrate will be exemplarily described below. The "patterning process" mentioned in the embodiments of the present disclosure includes processes such as photoresist coating, mask exposure, development, etching and photoresist stripping for metal materials, inorganic materials or transparent conductive materials, and includes processes such as organic material coating, mask exposure and development for organic materials. Deposition may be implemented by any one or more of sputtering, evaporation and chemical vapor deposition, coating may be implemented by any one or more of spraying coating, spin coating and ink-jet printing, and etching may be implemented by any one or more of dry etching and wet etching, and these are not limited in the present disclosure. "Thin film" refers to a layer of thin film made of a certain material on a base substrate by deposition, coating, or other processes. If a patterning process is not needed for the "thin film" in the whole making process, the "thin film" may be referred to as a "layer". If a patterning process is needed for the "thin film" in the whole making process, the thin film is referred to as a "thin film" before the patterning process and referred to as a "layer" after the patterning process. The "layer" after the patterning process includes at least one "pattern". In the present disclosure, "A and B are disposed on the same layer" means that A and B are simultaneously formed by a same patterning process, and a "thickness" of a film layer is the dimension of the film layer in a direction perpendicular to the display substrate. In exemplary embodiments of the present disclosure, "the orthographic projection of A includes the orthographic projection of B" means that a boundary of the orthographic projection of B falls within a range of a boundary of the orthographic projection of A or the boundary of the orthographic projection of A overlaps with the boundary of the orthographic projection of B.

Figure 3:
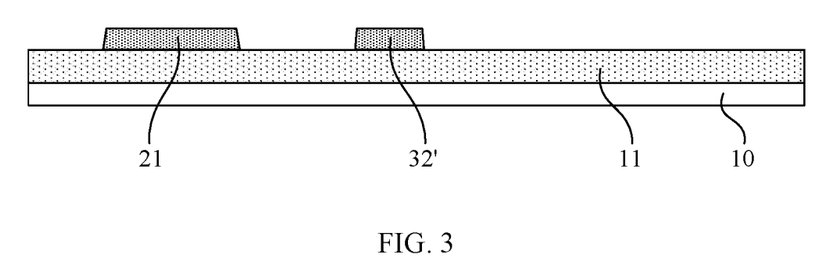
FIG. 3 is a schematic diagram after a pattern of a semiconductor layer is formed according to an exemplary embodiment of the present disclosure.

In an exemplary embodiment, the preparation process of the optoelectronic integrated substrate may include the following operations:

(1) A pattern of a semiconductor layer is formed. In an exemplary embodiment, forming the pattern of the semiconductor layer may include: sequentially depositing a first insulating thin film and an amorphous silicon thin film on a base substrate, converting the amorphous silicon thin film into a polysilicon thin film through a crystallization treatment, and then patterning the polysilicon thin film through a patterning process, to form a first insulating layer 11 disposed on the base substrate 10 and the pattern of the semiconductor layer disposed on the first insulating layer 11. The pattern of the semiconductor layer includes at least an active layer 21 and a polysilicon layer 32', as shown in FIG. 3.

In an exemplary embodiment, the base substrate may be a hard substrate or a flexible substrate, the hard substrate may be made of glass or the like, and the flexible substrate may be made of polyimide (PI) or the like. The function of the first insulating layer is to prevent metal ions in the base substrate from diffusing to the active layer, thereby preventing influences on characteristics such as threshold voltage and leakage current. A proper first insulating layer can improve the quality of a back interface of the polysilicon layer, prevent generation of leakage current at the back interface of the polysilicon layer, and reduce heat conduction, so as to slow down the cooling rate of silicon heated by laser.

In an exemplary embodiment, the crystallization treatment may include: treating the amorphous silicon thin film with a laser method to crystallize the amorphous silicon thin film into a polycrystalline silicon thin film. The laser may be XeCl laser, ArF laser, KrF laser, or XeF laser, etc. These excimer lasers generate laser beams in ultraviolet band, and by irradiating the amorphous silicon thin film with short pulse laser beams in ultraviolet band, the amorphous silicon thin film will quickly absorb the laser energy to melt and recrystallize.

Figure 4:
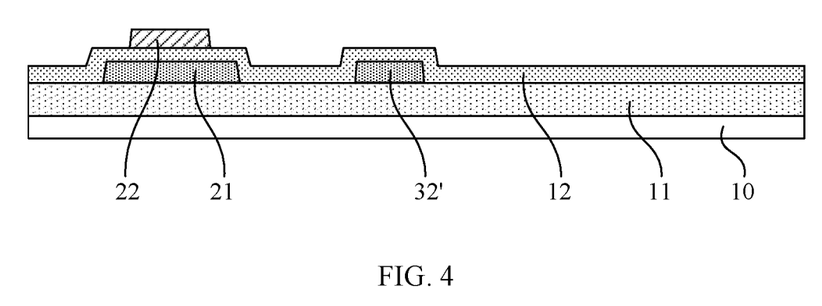
FIG. 4 is a schematic diagram after a pattern of a first metal layer is formed according to an exemplary embodiment of the present disclosure.

(2) A pattern of a first metal layer is formed. In an exemplary embodiment, forming the pattern of the first metal layer may include: sequentially depositing a second insulating thin film and a first metal thin film on the base substrate on which the aforementioned pattern has been formed, and patterning the first metal thin film through a patterning process, to form a second insulating layer 12 covering the pattern of the semiconductor layer and the pattern of the first metal layer disposed on the second insulating layer 12. The pattern of the first metal layer at least includes a gate electrode 22, as shown in FIG. 4.

In an exemplary embodiment, the pattern of the first metal layer may include a scanning signal line, and the gate electrode may be connected to the scanning signal line to form an integrated structure.

Figure 5:
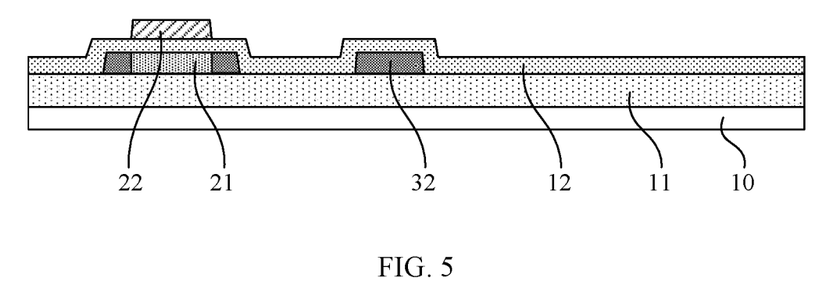
FIG. 5 is a schematic diagram after a pattern of an ohmic contact layer is formed according to an exemplary embodiment of the present disclosure.

(3) A pattern of an ohmic contact layer is formed. In an exemplary embodiment, forming the pattern of the ohmic contact layer may include: doping the active layer 21 and the polysilicon layer 32' by using the pattern of the gate electrode as a mask, so that an ohmic contact layer 32 is formed at the polysilicon layer 32' not shielded by the pattern of the gate electrode 22, source and drain doped regions are formed at the regions at two ends of the active layer 21 not shielded by the pattern of the gate electrode 22, and a channel region is formed at the middle region of the active layer 21 shielded by the pattern of the gate electrode 22 and not doped, as shown in FIG. 5.

In an exemplary embodiment, N-type ion implantation may be used for the doping treatment, the source and drain doped regions at two ends of the active layer 21 are N-type doped regions, and the ohmic contact layer 32 may be N-type doped polysilicon.

In an exemplary embodiment, P-type ion implantation may be used for the doping treatment, the source and drain doped regions at two ends of the active layer 21 are P-type doped regions, and the ohmic contact layer 32 may be P-type doped polysilicon.

Figure 6:
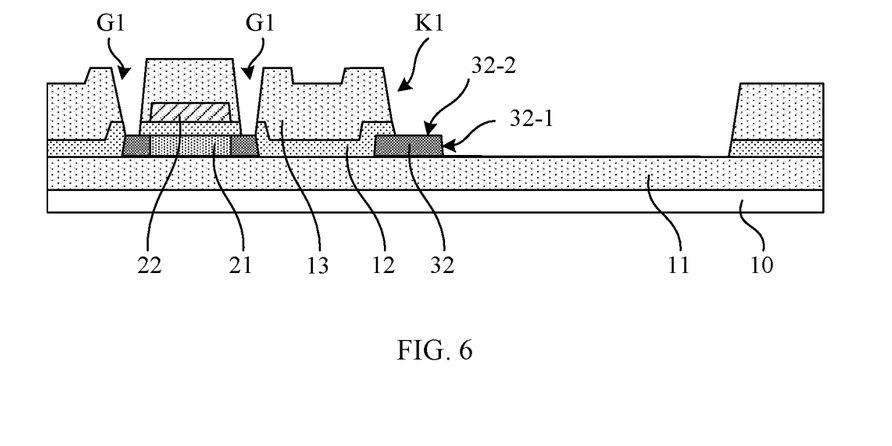
FIG. 6 is a schematic diagram after a pattern of a third insulating layer is formed according to an exemplary embodiment of the present disclosure.

(4) A pattern of a third insulating layer is formed. In an exemplary embodiment, forming the pattern of the third insulating layer may include: depositing a third insulating thin film on the base substrate on which the aforementioned patterns have been formed, and patterning the third insulating thin film through a patterning process to form a third insulating layer 13 covering the pattern of the first metal layer. The third insulating layer 13 is provided with a first via G1 and a first opening K1, and the third insulating layer 13 and the second insulating layer 12 in two first vias G1 are etched away, exposing the surfaces of the source and drain doped regions at two ends of the active layer 21. The third insulating layer 13 and the second insulating layer 12 in the first opening K1 are etched away, exposing part of the surface of the ohmic contact layer 32 and part of the surface of the first insulating layer 11, as shown in FIG. 6.

In an exemplary embodiment, that the first opening K1 exposes part of the surface of the ohmic contact layer 32, means that part of the surface of the ohmic contact layer 32 close to the active layer 21 is covered by the second insulating layer 12 and the third insulating layer 13, and part of the surface of the ohmic contact layer 32 away from the active layer 21 is located in the first opening K2, not covered by any film layer.

In an exemplary embodiment, the ohmic contact layer 32 exposed in the first opening K1 has a first surface 32-1 and a second surface 32-2. The normal direction of the first surface 32-1 may be perpendicular or nearly perpendicular to the direction of incident light (i.e., parallel or nearly parallel to the base substrate), while the normal direction of the second surface 32-2 is the direction of incident light (i.e., perpendicular to the base substrate).

Figure 7:
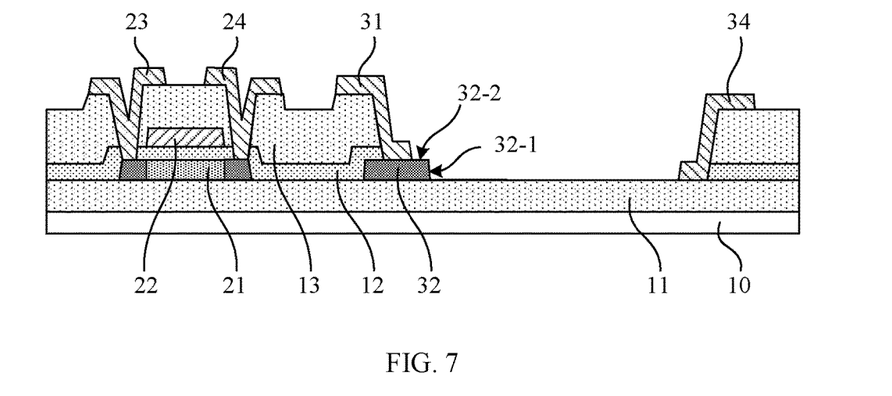
FIG. 7 is a schematic diagram after a pattern of a second metal layer is formed according to an exemplary embodiment of the present disclosure.

(5) A pattern of a second metal layer is formed. In an exemplary embodiment, forming the pattern of the second metal layer may include: depositing a second metal thin film on the base substrate on which the aforementioned patterns have been formed, and patterning the second metal thin film through a patterning process to form the pattern of the second metal layer on the third insulating layer 13. The pattern of the second metal layer at least includes a source electrode 23, a drain electrode 24, a first electrode 31 and a second electrode 34. The source electrode 23 and the drain electrode 24 are respectively connected to the source and drain doped regions at two ends of the active layer 21 through first vias G1, the first electrode 31 is connected to the ohmic contact layer 32, and the second electrode 34 is spaced apart from the first electrode 31, as shown in FIG. 7.

In an exemplary embodiment, the first electrode 31 may include a first segment, a second segment and a third segment connected in sequence, wherein the first segment is disposed on the third insulating layer 13 outside the first opening K1, the second segment is disposed on a side wall of the first opening K1 close to the active layer 21, and the third segment is disposed on the ohmic contact layer 32 inside the first opening K1. In an exemplary embodiment, the third segment of the first electrode 31 is in contact with part of the second surface 32-2 of the ohmic contact layer 32 to form a contact connection.

In an exemplary embodiment, the second electrode 34 may include a fourth segment, a fifth segment and a sixth segment connected in sequence, wherein the fourth segment is disposed on the third insulating layer 13 outside the first opening K1, the fifth segment is disposed on a side wall of the first opening K1 away from the active layer 21, and the sixth segment is disposed on the first insulating layer 11 inside the first opening K1.

So far, a thin film transistor (TFT) as a switch device in an optoelectronic integrated substrate has been formed on the base substrate. The thin film transistor may include an active layer 21, a gate electrode 22, a source electrode 23 and a drain electrode 24. The source electrode 23 and the drain electrode 24 are opposite to each other and connected to two ends of the active layer 21 through first vias G1, and the active layer between the source electrode 23 and the drain electrode 24 forms a channel region.

Figure 8:
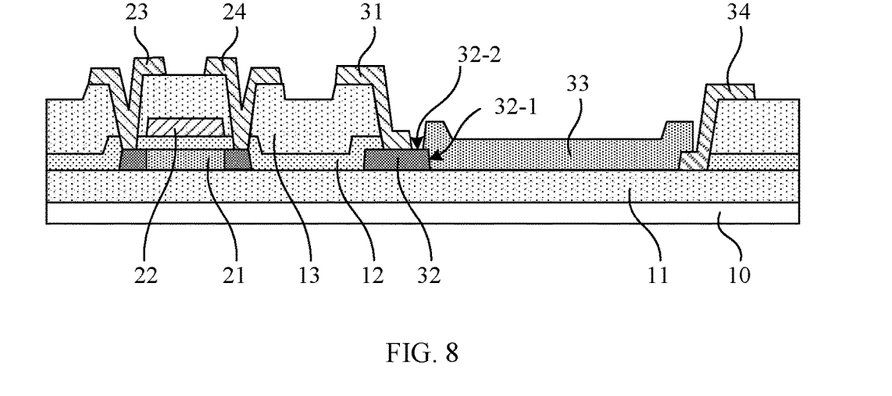
FIG. 8 is a schematic diagram after a pattern of an intrinsic amorphous silicon layer is formed according to an exemplary embodiment of the present disclosure.

(6) A pattern of an intrinsic amorphous silicon layer is formed. In an exemplary embodiment, forming the pattern of the intrinsic amorphous silicon layer may include: depositing an intrinsic amorphous silicon thin film on the base substrate on which the aforementioned patterns have been formed, and patterning the intrinsic amorphous silicon thin film through a patterning process to form a pattern of an intrinsic amorphous silicon layer 33 in the first opening K1. One end of the intrinsic amorphous silicon layer 33 close to the active layer 21 is connected to the ohmic contact layer 32, and one end of the intrinsic amorphous silicon layer 33 away from the active layer 21 is connected to the second electrode 34, as shown in FIG. 8.

In an exemplary embodiment, since the first electrode 31 is in contact connection with the ohmic contact layer 32 and the intrinsic amorphous silicon layer 33 is respectively connected to the ohmic contact layer 32 and the second electrode 34, the first electrode 31, the ohmic contact layer 32, the intrinsic amorphous silicon layer 33 and the second electrode 34 form a horizontal photo-diode.

In an exemplary embodiment, when the ohmic contact layer 32 is N-type doped polysilicon, since the intrinsic amorphous silicon layer is weak N-type, the first electrode and the intrinsic amorphous silicon layer form a Schottky contact, that is, a Schottky junction, and the photo-diode is a horizontal Schottky junction photo-diode. In an exemplary embodiment, the first electrode may adopt a high work function metal, such as molybdenum (Mo), copper (Cu) or lead (Pb).

In an exemplary embodiment, when the ohmic contact layer 32 is P-type doped polysilicon, since the intrinsic amorphous silicon layer is weak N-type, a PN junction is formed between the ohmic contact layer 32 and the intrinsic amorphous silicon layer 33, and the photo-diode is a horizontal PN junction photo-diode. In an exemplary embodiment, the first electrode may adopt a low work function metal, such as aluminum (Al), etc.

In an exemplary embodiment, the intrinsic amorphous silicon layer 33 in the first opening has a first side close to the thin film transistor and a second side away from the thin film transistor. The first side of the intrinsic amorphous silicon layer 33 is in contact with the first surface 32-1 of the ohmic contact layer 32 to form contact connection, and the second side of the intrinsic amorphous silicon layer 33 is in contact connection with the second electrode 34.

In an exemplary embodiment, the first side of the intrinsic amorphous silicon layer 33 is in contact with the first surface 32-1 of the ohmic contact layer 32 and a part of the second surface 32-2 of the ohmic contact layer 32, but the end of the intrinsic amorphous silicon layer 33 and the end of the first electrode 31, which are close to each other, are spaced apart. In practice, the width of the contact between the intrinsic amorphous silicon layer 33 and the second surface 32-2 of the ohmic contact layer 32 may be controlled to be the minimum through a preparation process.

In an exemplary embodiment, the orthographic projection of the intrinsic amorphous silicon layer 33 on the base substrate does not overlap with the orthographic projection of the thin film transistor on the base substrate.

So far, a photo-diode as an optical device in the optoelectronic integrated substrate has been formed on the base substrate. The photo-diode has a horizontal structure and includes a first electrode 31, an ohmic contact layer 32, an intrinsic amorphous silicon layer 33, and a second electrode 34. The first electrode 31 is connected to the ohmic contact layer 32. The two ends of the intrinsic amorphous silicon layer 33 are respectively connected to the ohmic contact layer 32 and the second electrode 34. The ohmic contact layer 32, the intrinsic amorphous silicon layer 33 and the second electrode 34 are sequentially arranged along a direction parallel to the plane of the base substrate.

(7) Patterns of a fourth insulating layer, a planarization layer and a protective layer are formed. In an exemplary embodiment, forming the fourth insulating layer, the planarization layer and the protective layer may include: firstly depositing a fourth insulating thin film on the base substrate on which the aforementioned patterns have been formed, to passivate the surface defects of the intrinsic amorphous silicon layer 33 to form a fourth insulating layer 14 covering the source electrode 23, the drain electrode 24, the first electrode 31, the second electrode 34 and the intrinsic amorphous silicon layer 33; then coating a planarization thin film to form a planarization layer 15 on the fourth insulating layer 14, and the planarization layer 15 is used to flatten the height difference between film layers in the region where the intrinsic amorphous silicon layer 33 is located; and then depositing a protective thin film to form a protective layer 16 on the planarization layer 15, as shown in FIG. 1.

At this point, the preparation of the optoelectronic integrated substrate according to the exemplary embodiment of this disclosure is completed. The optoelectronic integrated substrate includes a thin film transistor and a photo-diode. The thin film transistor is used as a switch device to control readout of electrical signals in the photo-diode, and the photo-diode of a horizontal structure is used as an optical device to carry out photoelectric conversion on incident light.

In an exemplary embodiment, the first insulating layer, the second insulating layer, the third insulating layer and the fourth insulating layer may be made of any one or more of silicon oxide (SiOx), silicon nitride (SiNx) and silicon oxynitride (SiON), and may be a single layer, multiple layers or a composite layer. The first insulating layer is referred to as a buffer layer, the second insulating layer is referred to as a gate insulating (GI) layer, the third insulating layer is referred to as an interlayer dielectric (ILD) layer, and the fourth insulating layer is referred to as a passivation (PVX) layer. Inorganic materials, such as SiOx, SiNx or SiON, may be used for the protective layer. The planarization layer may be made of an organic material such as resin. The first metal thin film and the second metal thin film may be made of metal materials, such as any one or more of silver (Ag), copper (Cu), aluminum (Al), titanium (Ti), and molybdenum (Mo), or an alloy material of the above metals, such as aluminum neodymium alloy (AlNd) or molybdenum niobium alloy (MoNb), and may be of a single-layer structure or multi-layer composite structure, such as Ti/Al/Ti.

Figure 9:
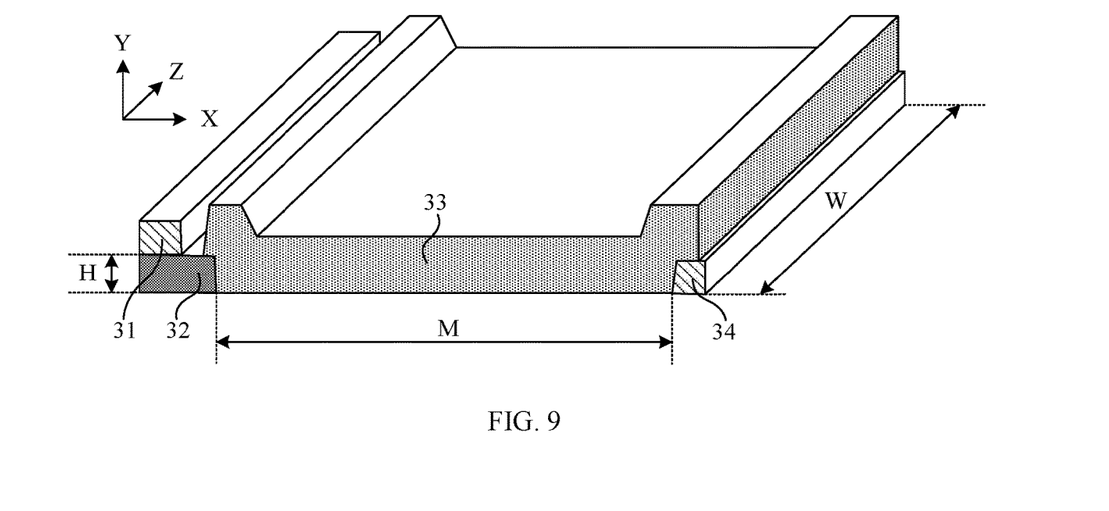
FIG. 9 is a schematic diagram of a structure of a horizontal photo-diode according to an exemplary embodiment of the present disclosure.

FIG. 9 is a schematic diagram of a structure of a horizontal photo-diode according to an exemplary embodiment of the present disclosure. As shown in FIG. 9, the photo-diode has a horizontal structure. The ohmic contact layer 32, the intrinsic amorphous silicon layer 33 and the second electrode 34 are arranged in a direction parallel to the base substrate. The first electrode 31 is connected to the ohmic contact layer 32, the intrinsic amorphous silicon layer 33 is disposed on one side of the ohmic contact layer 32 in the first direction X, the second electrode 34 is disposed on one side of the intrinsic amorphous silicon layer 33 in the first direction X, and the intrinsic amorphous silicon layer 33 is connected to the ohmic contact layer 32 and the second electrode 34 respectively. The light receiving surface of photo-diode is located in a plane parallel to the base substrate (XZ plane), and the junction surface of photo-diode is located in a plane perpendicular to the base substrate (YZ plane). The light receiving surface and the junction surface are in different planes, and the light-receiving area and the junction area are different.

In an exemplary embodiment, in the XZ plane, the intrinsic amorphous silicon layer 33 has a length longer than M in the first direction X and has a width W in the third direction Z, so the light receiving area of the intrinsic amorphous silicon layer 33 is about W*M, where M is the distance between the ohmic contact layer 32 and the second electrode 34. In the YZ plane, the ohmic contact layer 32 has a height H in the second direction Y and a width W in the third direction Z, so the junction area is about W*H. As such, by adjusting the length M of the intrinsic amorphous silicon layer 33, the size of the light receiving area can be adjusted, thereby adjusting the responsivity of the photo-diode. By adjusting the height H of the ohmic contact layer 32, the junction area can be adjusted, thereby adjusting the response speed of the photo-diode. Thus the problem that the responsivity and response speed of the current optoelectronic integrated circuit are mutually restricted is effectively avoided.

According to the formula for calculating RC delay time $\tau_C$, $$\tau_C = 2.2 R_L \times C_j = 2.2 R_L \times \frac{W \times H \times \varepsilon}{M}$$

From the formula for calculating the RC delay time $\tau_C$, it can be seen that the RC delay time $\tau_C$ of a horizontal structure photo-diode is not restricted by the thickness of the intrinsic amorphous silicon layer. So the thickness of the intrinsic amorphous silicon layer may be reduced to reduce the absorption of long wavelength ambient light by the intrinsic amorphous silicon layer on the basis of ensuring the absorption of short wavelength signal light, thereby improving the spectral selectivity and lowering the bit error rate. Generally, the thickness of the intrinsic amorphous silicon layer in a current vertical structure photo-diode is about 1000 nm, and with such a thickness, the absorption of long wavelength ambient light is large. In an exemplary embodiment of the present disclosure, the thickness of the intrinsic amorphous silicon layer in the horizontal structure photo-diode may be set to about 50 nm to 500 nm, which effectively reduces the absorption of long wavelength ambient light on the basis of ensuring the absorption of short wavelength signal light, thereby enhancing the spectral selectivity of the photo-diode, and facilitating reduction of the bit error rate. As the response speed of a photo-diode is related to a junction capacitance and the junction capacitance is related to the junction area, the thinner the intrinsic amorphous silicon layer, the faster the response speed of the photo-diode. In addition, by increasing the distance M between the ohmic contact layer and the second electrode, the RC delay time $\tau_C$ can be reduced and the response speed of the photo-diode can be increased, and the light receiving area of the intrinsic amorphous silicon layer can be increased and the responsivity of the photo-diode can be increased.

It can be seen from the above-described structure and preparation process of the optoelectronic integrated substrate that, in the optoelectronic integrated substrate provided by the exemplary embodiment of the present disclosure, the ohmic contact layer and the intrinsic amorphous silicon layer are sequentially arranged along a direction perpendicular to the incident light to form a horizontal photo-diode, and the junction surface of the horizontal photo-diode is parallel or substantially parallel to the direction of the incident light, which can increase the light receiving area and reduce the junction capacitance, effectively solve the problem that the responsivity and response speed of the current optoelectronic integrated circuit are mutually restricted, thereby simultaneously increases the responsivity and the response speed. The response speed of the horizontal photo-diode in the exemplary embodiment of the present disclosure is not restricted by the thickness of the intrinsic amorphous silicon layer, so the thickness of the intrinsic amorphous silicon layer may be effectively reduced to reduce the absorption of long wavelength ambient light by the intrinsic amorphous silicon layer on the basis of ensuring the absorption of short wavelength signal light, thereby improving the spectral selectivity and lowering the bit error rate effectively.

The preparation process of the optoelectronic integrated substrate in the exemplary embodiment of the present disclosure can be well compatible with the existing preparation process, and has advantages of simple process realization, easy implementation, high production efficiency, low production cost and high yield rate.

Figure 10:
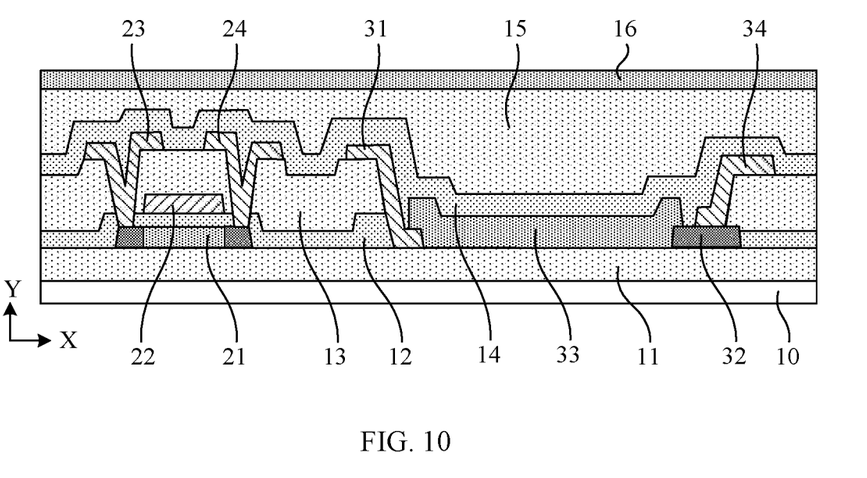
FIG. 10 is a schematic diagram of a structure of another optoelectronic integrated substrate according to an exemplary embodiment of the present disclosure.

FIG. 10 is a schematic diagram of a structure of another optoelectronic integrated substrate according to an exemplary embodiment of the present disclosure. The structures of the thin film transistor and insulating layers etc. in the optoelectronic integrated substrate of this exemplary embodiment are basically the same as those of the previous embodiments, except that the ohmic contact layer 32 in the photo-diode is connected to the second electrode 34. As shown in FIG. 10, a first electrode 31, an ohmic contact layer 32 and an intrinsic amorphous silicon layer 33 in the photo-diode are sequentially arranged along a direction parallel to the plane of the base substrate. The ohmic contact layer 32 and the intrinsic amorphous silicon layer 33 are arranged between the first electrode 31 and the second electrode 34. The first electrode 31 is connected to the intrinsic amorphous silicon layer 33. The intrinsic amorphous silicon layer 33 is connected to the ohmic contact layer 32, and the ohmic contact layer 32 is connected to the second electrode 34.

In an exemplary embodiment, the second insulating layer 12 and the third insulating layer 13 in the region where the photo-diode is located form a composite insulating layer. The composite insulating layer is provided with a first opening, which exposes part of the ohmic contact layer 32. The first electrode 31 is disposed on a side wall of the first opening close to the thin film transistor, and the second electrode 34 is disposed on a side wall of the first opening away from the thin film transistor and connected to the ohmic contact layer 32. The first electrode 31 and the second electrode 34 are spaced apart. The intrinsic amorphous silicon layer 33 is disposed in the first opening, including a first side close to the thin film transistor and a second side away from the thin film transistor. The first side of the intrinsic amorphous silicon layer 33 is connected to the first electrode 31, and the second side of the intrinsic amorphous silicon layer 33 is connected to the ohmic contact layer 32. In this exemplary embodiment, the ohmic contact layer 32 is located on a side of the first opening away from the thin film transistor.

In an exemplary embodiment, the ohmic contact layer 32 includes a first surface of which a normal direction is opposite to the first direction X and a second surface of which a normal direction is the second direction Y. The first surface of the ohmic contact layer 32 is in contact connection with the second side of the intrinsic amorphous silicon layer 33 to form a junction region whose junction direction is opposite to the first direction X. The junction direction is perpendicular to the direction of incident light, that is, the plane of the junction region is parallel to the direction of incident light. In addition, the second surface of the ohmic contact layer 32 is in contact connection with the second electrode 34.

In an exemplary embodiment, the thickness of the intrinsic amorphous silicon layer 33 may be about 50 nm to 500 nm, and the distance between the first electrode 31 and the ohmic contact layer 32 may be greater than 1000 nm.

The preparation process of the optoelectronic integrated substrate in this exemplary embodiment is basically similar to that in the previous embodiments, and the difference is: in forming the pattern of the third insulating layer, part of the surface of the ohmic contact layer 32 away from the active layer 21 is covered by the second insulating layer 12 and the third insulating layer 13, and part of the surface of the ohmic contact layer 32 close to the active layer 21 is located in the first opening K2, not covered by any film layer. In forming the pattern of the second metal layer pattern, the second electrode 34 is connected to the ohmic contact layer 32. In forming the pattern of the intrinsic amorphous silicon layer, the first side of the intrinsic amorphous silicon layer 33 is in contact connection with the first electrode 31, and the second side of the intrinsic amorphous silicon layer 33 is in contact connection with the ohmic contact layer 32.

The optoelectronic integrated substrate provided by the exemplary embodiment of the present disclosure can also increase the light receiving area and reduce the junction capacitance, effectively solve the problem that the responsivity and response speed of the current optoelectronic integrated circuit are mutually restricted, thereby simultaneously increases the responsivity and the response speed, and may also effectively reduce the thickness of the intrinsic amorphous silicon layer, and thus reduce the absorption of long wavelength ambient light by the intrinsic amorphous silicon layer, which effectively improves the spectral selectivity and lower the bit error rate.

It should be noted that the aforementioned exemplary embodiments are only examples of preparing the optoelectronic integrated substrate, and the embodiments of the present disclosure are not limited thereto. In practice, the preparation process may be adjusted according to actual needs.

An embodiment of the present disclosure further provides a preparation method of an optoelectronic integrated circuit, which is used for preparing the optoelectronic integrated substrate of the aforementioned exemplary embodiment. In an exemplary embodiment, the preparation method of the optoelectronic integrated substrate may include: forming an electronic device and a photo-diode on a base substrate; wherein the photo-diode includes an ohmic contact layer and an intrinsic amorphous silicon layer, and the ohmic contact layer and the intrinsic amorphous silicon layer are sequentially arranged along a direction parallel to the plane of the base substrate and are connected.

In an exemplary embodiment, forming a photo-diode on a base substrate may include: forming an ohmic contact layer on the base substrate; forming a composite insulating layer, wherein the composite insulating layer is provided with a first opening exposing the ohmic contact layer; forming a first electrode and a second electrode, wherein the first electrode is disposed on a side wall of the first opening close to the electronic device and connected to the ohmic contact layer, and the second electrode is disposed on a side wall of the first opening away from the electronic device; forming an intrinsic amorphous silicon layer in the first opening, wherein the intrinsic amorphous silicon layer includes a first side close to the electronic device and a second side away from the electronic device in a plane parallel to the base substrate; the first side of the intrinsic amorphous silicon layer is connected to the ohmic contact layer, and the second side of the intrinsic amorphous silicon layer is connected to the second electrode.

In an exemplary embodiment, forming a photo-diode on a base substrate may include: forming an ohmic contact layer on the base substrate; forming a composite insulating layer, wherein the composite insulating layer is provided with a first opening exposing the ohmic contact layer; forming a first electrode and a second electrode, wherein the first electrode is disposed on a side wall of the first opening close to the electronic device, and the second electrode is disposed on a side wall of the first opening away from the electronic device and connected to the ohmic contact layer; forming an intrinsic amorphous silicon layer in the first opening, wherein the intrinsic amorphous silicon layer includes a first side close to the electronic device and a second side away from the electronic device in a plane parallel to the base substrate; the first side of the intrinsic amorphous silicon layer is connected to the first electrode, and the second side of the intrinsic amorphous silicon layer is connected to the ohmic contact layer.

In an exemplary embodiment, the electronic device includes a thin film transistor, and forming an electronic device on a base substrate includes: forming an active layer on the base substrate; forming a second insulating layer covering the active layer, and a gate electrode disposed on the second insulating layer; forming a third insulating layer covering the gate electrode, wherein the third insulating layer is provided with first vias exposing the active layer; and forming a source electrode and a drain electrode on the third insulating layer, wherein the source electrode and the drain electrode are respectively connected to the active layer through the first vias.

In an exemplary embodiment, the active layer and the ohmic contact layer are disposed in a same layer and formed through a same patterning process.

In an exemplary embodiment, the first vias and the first opening are formed through a same patterning process.

In an exemplary embodiment, the source electrode and the drain electrode are disposed in a same layer as the first electrode and the second electrode, and are formed through a same patterning process.

The content of the preparation method of the optoelectronic integrated substrate in the embodiment of the present disclosure has been described in detail in the preparation process of the optoelectronic integrated substrate, and will not be repeated here.

According to the preparation method of the optoelectronic integrated substrate provided by the embodiment of the disclosure, the ohmic contact layer and the intrinsic amorphous silicon layer are sequentially arranged along the direction perpendicular to the incident light to form a horizontal photo-diode, and the junction surface of the horizontal photo-diode is parallel or substantially parallel to the direction of the incident light, which can increase the light receiving area and reduce the junction capacitance, effectively solve the problem that the responsivity and response speed of the current optoelectronic integrated circuit are mutually restricted, thereby simultaneously increases the responsivity and the response speed. The exemplary embodiment in the present disclosure may effectively reduce the thickness of the intrinsic amorphous silicon layer and thus reduce the absorption of long wavelength ambient light by the intrinsic amorphous silicon layer, which effectively improves the spectral selectivity and lowers the bit error rate. The preparation process of the optoelectronic integrated substrate in the exemplary embodiment of the present disclosure can be well compatible with the existing preparation process, and has advantages of simple process realization, easy implementation, high production efficiency, low production cost and high yield rate.

An embodiment of the disclosure further provides an optoelectronic integrated circuit, which includes the optoelectronic integrated substrate of the aforementioned exemplary embodiment.

Although the embodiments disclosed in the present disclosure are as described above, the content described is only the embodiments used to facilitate the understanding of the present disclosure, and is not intended to limit the present disclosure. Those skilled in the art may make any modification and variation in the form and details of the implementation without departing from the spirit and scope of the present disclosure. However, the scope of protection of the present disclosure shall still be subject to the scope defined by the attached claims.

What we claim is:

1. An optoelectronic integrated substrate, comprising a base substrate, and an electronic device and a photo-diode disposed on the base substrate,
wherein the photo-diode comprises an ohmic contact layer and an intrinsic amorphous silicon layer, and the ohmic contact layer and the intrinsic amorphous silicon layer are sequentially arranged along a direction parallel to a plane of the base substrate and are connected;
wherein the photo-diode further comprises a first electrode, a second electrode and a composite insulating layer, and the composite insulating layer is provided with a first opening exposing the ohmic contact layer;
wherein the first electrode is disposed on a side wall of the first opening close to the electronic device and connected to the ohmic contact layer, and the second electrode is disposed on a side wall of the first opening away from the electronic device; the intrinsic amorphous silicon layer is disposed in the first opening and comprises a first side close to the electronic device and a second side away from the electronic device; the first side of the intrinsic amorphous silicon layer is connected to the ohmic contact layer, and the second side of the intrinsic amorphous silicon layer is connected to the second electrode; or,
wherein the first electrode is disposed on a side wall of the first opening close to the electronic device, and the second electrode is disposed on a side wall of the first opening away from the electronic device and connected to the ohmic contact layer; the intrinsic amorphous silicon layer is disposed in the first opening and comprises a first side close to the electronic device and a second side away from the electronic device; the first side of the intrinsic amorphous silicon layer is connected to the first electrode, and the second side of the intrinsic amorphous silicon layer is connected to the ohmic contact layer.

2. The optoelectronic integrated substrate of claim 1, wherein the ohmic contact layer comprises a first surface of which a normal direction is a first direction and a second surface of which a normal direction is a second direction, wherein the second direction is a direction of incident light, and the first direction intersects the second direction; and the first surface of the ohmic contact layer is in contact connection with the first side or the second side of the intrinsic amorphous silicon layer.

3. The optoelectronic integrated substrate of claim 2, wherein the second surface of the ohmic contact layer is in contact connection with the first electrode or the second electrode.

4. The optoelectronic integrated substrate of claim 1, wherein the electronic device comprises a thin film transistor; the thin film transistor comprises a gate electrode, an active layer, a source electrode and a drain electrode, the first electrode and the second electrode of the photo-diode are disposed in a same layer as the source electrode and the drain electrode of the thin film transistor, and the ohmic contact layer of the photo-diode is disposed in a same layer as the active layer of the thin film transistor.

5. The optoelectronic integrated substrate of claim 4, wherein the thin film transistor further comprises a second insulating layer and a third insulating layer, wherein the second insulating layer covers the active layer, the gate electrode is disposed on the second insulating layer, the third insulating layer covers the gate electrode, a first via exposing the active layer is disposed on the second insulating layer and the third insulating layer, and the first via and the first opening are formed through a same patterning process.

6. The optoelectronic integrated substrate of claim 1, wherein the ohmic contact layer comprises a P-type doped semiconductor or an N-type doped semiconductor.

7. The optoelectronic integrated substrate of claim 1, wherein a thickness of the intrinsic amorphous silicon layer is 50 nm to 500 nm.

8. An optoelectronic integrated circuit, comprising an optoelectronic integrated substrate comprising:
a base substrate, and an electronic device and a photo-diode disposed on the base substrate, wherein the photo-diode comprises an ohmic contact layer and an intrinsic amorphous silicon layer, and the ohmic contact layer and the intrinsic amorphous silicon layer are sequentially arranged along a direction parallel to a plane of the base substrate and are connected;
wherein the photo-diode further comprises a first electrode, a second electrode and a composite insulating layer, and the composite insulating layer is provided with a first opening exposing the ohmic contact layer; wherein the first electrode is disposed on a side wall of the first opening close to the electronic device and connected to the ohmic contact layer, and the second electrode is disposed on a side wall of the first opening away from the electronic device; the intrinsic amorphous silicon layer is disposed in the first opening and comprises a first side close to the electronic device and a second side away from the electronic device; the first side of the intrinsic amorphous silicon layer is connected to the ohmic contact layer, and the second side of the intrinsic amorphous silicon layer is connected to the second electrode; or, wherein the first electrode is disposed on a side wall of the first opening close to the electronic device, and the second electrode is disposed on a side wall of the first opening away from the electronic device and connected to the ohmic contact layer; the intrinsic amorphous silicon layer is disposed in the first opening and comprises a first side close to the electronic device and a second side away from the electronic device; the first side of the intrinsic amorphous silicon layer is connected to the first electrode, and the second side of the intrinsic amorphous silicon layer is connected to the ohmic contact layer.

9. The optoelectronic integrated circuit of claim 8, wherein the ohmic contact layer comprises a first surface of which a normal direction is a first direction and a second surface of which a normal direction is a second direction, wherein the second direction is a direction of incident light, and the first direction intersects the second direction; and the first surface of the ohmic contact layer is in contact connection with the first side or the second side of the intrinsic amorphous silicon layer.

10. The optoelectronic integrated circuit of claim 9, wherein the second surface of the ohmic contact layer is in contact connection with the first electrode or the second electrode.

11. The optoelectronic integrated circuit of claim 8, wherein the electronic device comprises a thin film transistor; the thin film transistor comprises a gate electrode, an active layer, a source electrode and a drain electrode, the first electrode and the second electrode of the photo-diode are disposed in a same layer as the source electrode and the drain electrode of the thin film transistor, and the ohmic contact layer of the photo-diode is disposed in a same layer as the active layer of the thin film transistor.

12. The optoelectronic integrated circuit of claim 11, wherein the thin film transistor further comprises a second insulating layer and a third insulating layer, wherein the second insulating layer covers the active layer, the gate electrode is disposed on the second insulating layer, the third insulating layer covers the gate electrode, a first via exposing the active layer is disposed on the second insulating layer and the third insulating layer, and the first via and the first opening are formed through a same patterning process.

13. The optoelectronic integrated circuit of claim 8, wherein the ohmic contact layer comprises a P-type doped semiconductor or an N-type doped semiconductor.

14. The optoelectronic integrated circuit of claim 8, wherein a thickness of the intrinsic amorphous silicon layer is 50 nm to 500 nm.

15. A preparation method of an optoelectronic integrated substrate, comprising:
forming an electronic device and a photo-diode on a base substrate; wherein the photo-diode comprises an ohmic contact layer and an intrinsic amorphous silicon layer, and the ohmic contact layer and the intrinsic amorphous silicon layer are sequentially arranged along a direction parallel to a plane of the base substrate and are connected;
wherein forming the photo-diode on the base substrate comprises:
forming the ohmic contact layer on the base substrate;
forming a composite insulating layer, wherein the composite insulating layer is provided with a first opening exposing the ohmic contact layer; and
forming a first electrode and a second electrode, wherein the first electrode is disposed on a side wall of the first opening close to the electronic device and connected to the ohmic contact layer, and the second electrode is disposed on a side wall of the first opening away from the electronic device; forming the intrinsic amorphous silicon layer in the first opening, wherein the intrinsic amorphous silicon layer comprises a first side close to the electronic device and a second side away from the electronic device in a plane parallel to the base substrate; the first side of the intrinsic amorphous silicon layer is connected to the ohmic contact layer, and the second side of the intrinsic amorphous silicon layer is connected to the second electrode; or,
forming a first electrode and a second electrode, wherein the first electrode is disposed on a side wall of the first opening close to the electronic device, and the second electrode is disposed on a side wall of the first opening away from the electronic device and connected to the ohmic contact layer; forming the intrinsic amorphous silicon layer in the first opening, wherein the intrinsic amorphous silicon layer comprises a first side close to the electronic device and a second side away from the electronic device in a plane parallel to the base substrate; the first side of the intrinsic amorphous silicon layer is connected to the first electrode, and the second side of the intrinsic amorphous silicon layer is connected to the ohmic contact layer.

16. The preparation method of claim 15, wherein, the electronic device comprises a thin film transistor, and forming the electronic device on the base substrate comprises:
forming an active layer on the base substrate;
forming a second insulating layer covering the active layer, and a gate electrode disposed on the second insulating layer;
forming a third insulating layer covering the gate electrode, wherein the third insulating layer is provided with first vias exposing the active layer; and
forming a source electrode and a drain electrode on the third insulating layer, wherein the source electrode and the drain electrode are respectively connected to the active layer through the first vias.

17. The preparation method of claim 16, wherein
the active layer and the ohmic contact layer are disposed in a same layer and formed through a same patterning process;
the first vias and the first opening are formed through a same patterning process;

the source electrode and the drain electrode are disposed in a same layer as the first electrode and the second electrode, and are formed through a same patterning process.

* * * * *